United States Patent [19]

Kim

[11] 4,373,966

[45] Feb. 15, 1983

[54] FORMING SCHOTTKY BARRIER DIODES BY DEPOSITING ALUMINUM SILICON AND COPPER OR BINARY ALLOYS THEREOF AND ALLOY-SINTERING

[75] Inventor: Sang U. Kim, Essex Junction, Vt.

[73] Assignee: International Business Machines Corporation, Armonk, N.Y.

[21] Appl. No.: 259,311

[22] Filed: Apr. 30, 1981

[51] Int. Cl.$^3$ ............................................. H01L 7/00
[52] U.S. Cl. ..................................... 148/1.5; 29/578; 29/590; 148/187; 357/67; 357/91; 427/84; 428/620; 428/641
[58] Field of Search ............... 428/620, 641; 148/1.5, 148/187; 29/590, 578; 427/84; 357/67, 91; 75/139

[56] References Cited

U.S. PATENT DOCUMENTS

| | | | |
|---|---|---|---|
| 3,695,855 | 10/1972 | Ainsle et al. | 428/620 |
| 3,725,309 | 4/1973 | Ames et al. | 252/512 |
| 3,871,067 | 3/1975 | Bogardus et al. | 29/571 |
| 3,881,971 | 5/1975 | Greer et al. | 357/67 |
| 4,199,386 | 4/1980 | Rosnowski et al. | 148/188 |

OTHER PUBLICATIONS

Learn, A. J., Jour. Electronics Materials, 3, (1974), 531.
Brack et al., IBM-TDB, 19, (1976), 2592.
Harris et al., Jour. Appl. Phys., 48, (1977), 2897.
Nowick et al., Thin Solid Films, 67, (1980), 385.

*Primary Examiner*—Upendra Roy
*Attorney, Agent, or Firm*—Francis J. Thornton

[57] ABSTRACT

This describes four distinct methods of forming copper and silicon doped aluminum conductive structures on the surface of the semiconductor body which when sintered will form in conjunction with the exposed surface of the silicon body Schottky diodes which are resistant to internal field emission characteristics created by co-incidental copper-aluminum precipitates and aluminum doped solid phase epitaxial growths.

7 Claims, No Drawings

FORMING SCHOTTKY BARRIER DIODES BY DEPOSITING ALUMINUM SILICON AND COPPER OR BINARY ALLOYS THEREOF AND ALLOY-SINTERING

BACKGROUND OF THE INVENTION

1. Field of the Invention

This invention relates generally to copper and silicon doped aluminum lines used in integrated circuit devices and more particularly to a technique for improving schottky diodes formed between such lines and a silicon body by reducing the formation of parasitic zener diodes in semiconductor devices.

2. Description of the Prior Art

The use of metal interconnecting lines on silicon semiconductor bodies in the formation of integrated circuits is well known. It has been found that if such lines are formed of specific combinations of various metals such as copper, aluminum and silicon, significant benefits and improvements can be realized in the integrated devices formed with such lines. In the prior art it is well known that it is desirable to minimize alloying and penetration of the aluminum in the line into the silicon body during subsequent processing. This is achieved by adding at least 1-2% silicon by weight to the aluminum layer prior to the subsequent processing. By so saturating the aluminum layer with this quantity of silicon, sufficient to satisfy the solubility limits, the rate of alloying and spiking penetration of the aluminum of the line with the underlying silicon body is minimized.

It is also known to the prior art to add approximately 4 to 5 weight % of copper to such aluminum-silicon lines so as to provide a current conductive line which is resistant to circuit failure arising as a consequent of current induced mask transport phenomenon, i.e. electromigration which causes breaking of the lines. This is taught in U.S. Pat. No. 3,725,309 issued Apr. 3, 1973, to I. Ames et al and assigned to the same assignee as the present invention. In addition to using such lines to interconnect the elements forming the integrating circuit such metal lines are also used to form schottky barrier diodes in the integrated circuit. Schottky barrier diodes so formed are determined by the difference in work function between the metal line and the silicon body on which they are formed.

When metal lines comprised of aluminum, copper and silicon are deposited on a silicon body and sintered to form a schottky barrier device adverse effects occur, due to silicon and copper precipitation out of the metal line. Such precipitation can cause the formed schottky barrier diode to fail. This is especially true when both copper and aluminum precipitates coincide, forming a parasitic zener diode.

SUMMARY OF THE INVENTION

Therefore, it is an object of the present invention to provide an improved metal line for use in integrated circuits and particularly a line which will, when sintered in contact with a silicon body, provide reliable Schottky barrier diodes which are easily manufacturable.

Broadly speaking the present invention accomplishes this by depositing the metal layers used to form the line on the silicon body in a sequence such that the silicon and copper precipitates, created in the body by the sintering step, are isolated one from the other thus preventing defects in the formed schottky barrier junction devices.

The present invention achieves this by selectively depositing the metals forming the line in specific sequences such that coincidental precipitates of aluminum and copper are prevented from occuring in the silicon body.

These and other objects, features and accomplishments of the present invention will be better understood from the following description of the preferred embodiments.

DESCRIPTION OF THE PREFERRED EMBODIMENTS

The present invention teaches a method whereby one can separate the precipitates from composite metal lines from each other when the metal lines are sintered on the surface of the semiconductor body.

When uniformly doped copper-silicon aluminum metallurgy is deposited on a silicon body and heated to above 400° C., both precipitates of aluminum copper ($CuAl_2$) and aluminum doped solid phase epitaxial growth known as silicon mounds occur in the surface of the body. Whenever copper and Al are introduced in quantities exceeding the solid solubility limit, both the $CuAl_2$ precipitates and the silicon mounds form during the post metalization sintering cycle required for formation of schottky diodes. The silicon mounds (solid phase epitaxial growth) form localized, parasitic p+ n junction diode islands within the schottky contact. The silicon mounds are considered to be highly disordered with defects such as dislocations and stacking faults. When $CuAl_2$ precipitates are in contact with silicon mounds, free copper is released from dissolution of the $CuAl_2$ precipitates during the sintering or possibly due to high current density during field operation and diffuses and precipitates at the sites of dislocations and stacking faults within the silicon mounds. When this occurs within the space charge region of the parasitic p+ n junction, localized, high fields often in order of 10 V/m are created and the schottky diode fails.

The present invention teaches four different methods for laying down the metallurgy to form the improved Schottky barrier devices of the invention. Each method avoids the problems set out above and results in improved Schottky diodes which do not suffer the above described failure mechanism. The four methods are: 1. A method of forming a schottky diode consisting of depositing a layer of silicon doped copper on a silicon body, depositing a layer of aluminum on the silicon doped copper and sintering the entire unit.

2. A method of forming a schottky barrier diode consisting of depositing a layer of silicon on a silicon body, depositing a layer of copper doped aluminum on the surface of the silicon layer and sintering the body.

3. A method for preventing aluminum-copper precipitates on the surface of a silicon semiconductor when using copper doped aluminum metallurgy to form a schottky diode consisting of the steps of depositing on the semiconductor layer a layer of aluminum, depositing on the aluminum a layer of silicon, and depositing on the layer of silicon a layer of copper followed by a sintering of the entire structure.

4. A method whereby a schottky barrier diode is formed by depositing a layer of silicon doped aluminum on the body, depositing a layer of the copper doped aluminum on the surface of the silicon doped aluminum layer and sintering the body.

More specifically, the integrated circuit in which the Schottky diode is to be formed is placed in an evaporator preferably a so-called E-gun evaporator. Such E-gun evaporators are well known and widely used in the semiconductor industry and are basically comprised of a chamber which can be evacuated to a very low pressure. In the chamber is a heated support for the substrate on which the material is to be deposited and one or more crucibles containing the materials to be deposited. In the chamber there is also provided one or more electron guns. Impressing of an electron beam on the material in a crucible causes heating evaporation of the material in the crucible. Co-depositions of material from one or more of the crucibles can be achieved by simultaneously impressing an electron beam on each of the different crucibles.

Method 1—A silicon substrate containing an integrated circuit and coated with an insulating layer having apertures through which the surface of the substrate is exposed is placed in such an evaporation chamber and heated to 200° C. A 600 angstrom thick layer of silicon doped with a 4-5% of copper by weight is deposited by evaporation on the surface of the operational insulating layer. Following this a 9400 angstrom thick layer of aluminum is evaporated onto the silicon doped aluminum layer. The layers of aluminum and copper doped silicon are then defined so as to form a desired line configuration. This formation of the desired line configuration is achieved by selective photolithography and chemical etching techniques well known to the semiconductor art.

Once the aluminum and copper doped layers are defined into lines the entire unit is heated at about 420° C. for about 25 minutes. This sintering of the unit is such that the aluminum and copper doped silicon layers are fused together. Simultaneously a schottky diode is formed anywhere the fused lines contact an exposed surface of the silicon substrate.

Method 2—A silicon substrate containing an integrated circuit as described in method 1 is placed in an evaporator and heated to 200° C. A layer of silicon 200 angstrom thick is deposited over the aperatured insulating layer, a layer of aluminum doped with approximately 4% copper is deposited onto the 200 angstrom thick layer of silicon. This aluminum-copper layer is deposited to a thickness of approximately 8400 angstroms. Lines are defined in the deposited layers by using the photolithography and chemical etching techniques referred to above. Once the lines are so formed the entire unit is placed in a furnace and sintered at 420° C. for 25 minutes. Once again as the lines are sintered, schottky diodes are formed where ever the sintered lines come in contact with the exposed surface of the silicon substrate.

Method 3—In this method a silicon substrate containing an integrated circuit similar to that described in method one is placed in an evaporator and heated to 200° C. A layer of aluminum 9600 angstroms thick is deposited on the silicon body. Over this aluminum layer, a layer of silicon, 200 angstroms thick, is deposited. Superimposed upon this silicon layer is a layer of copper to the thickness of 300 angstroms. Once the three layers are formed they are defined using the photolithography and chemical etching procedures discussed above and the unit is sintered at 420° C. for 25 minutes to form a Schottky diode whenever the metallurgy comes in contact with the silicon body.

Method 4—An integrated circuit substrate as described in method 1 is heated to a temperature of 200° C. in the evaporator. A 9700 thick angstrom layer of aluminum containing 0.8% by weight of the silicon is evaporated onto the integrated circuit. A 300 angstrom thick layer of copper is then overlayed on the silicon doped aluminum layer. These layers are treated with photolithography and chemical etching to define lines therein. Once the lines are so defined the entire unit is heated to 420° C. and Schottky diodes are formed wherever the lines contact the exposed surfaces of the silicon substrate.

The four structures described above are extremely useful and normally preferred since by utilizing the described methods the possibility of aluminum silicate precipitates or aluminum-copper precipitates being formed co-incidently in the underlying silicon body is substantially eliminated and improved Schottky barrier diodes are formed.

Thus, there has been described several improved methods for creating improved Schottky barrier diodes formed between copper and silicon doped aluminum lines and a silicon body by reducing the formation of parasitic zener diodes in semiconductor devices which parasitic zener diodes are formed by the coincidence of aluminum silicates and copper aluminum precipitates.

Of course, it is obvious to those skilled in the art that variations on the above prosesses can be made. For example, the deposition of the various layers can be performed in evaporators other than the above described electron beam evaporator and the other methods of deposition of the layers can be employed.

While the invention has been particularly described with reference to the preferred embodiments thereof it will be understood by those skilled in the art that the foregoing and other changes in form and details be made therein without departing from the spirit and scope of the invention.

What is claimed is:

1. A method of forming a Schottky diode comprising the steps of
   depositing a layer of copper doped silicon on a silicon body
   depositing a layer of aluminum on said copper doped silicon layer, and
   sintering the entire unit.

2. A method of forming a Schottky barrier diode comprising the steps of;
   depositing a layer of silicon on the surface of a silicon body,
   depositing a layer of copper doped aluminum on the surface of said deposited silicon layer, and
   sintering the body at a temperature in excess of 400° C.

3. A method of forming an aluminum-copper precipitates free Schottky diode in a silicon body while using copper doped aluminum metallurgy to form the diode comprising of the steps of;
   depositing on a silicon body a layer of aluminum,
   depositing a layer of silicon on said layer of aluminum, and
   depositing on the layer of said silicon a layer of copper, and
   sintering said body at a temperature in excess of 400° C.

4. A method whereby a Schottky barrier diode is formed in a silicon body comprised the steps of;
   depositing a layer of silicon doped silicon on the surface of a silicon body,
   depositing a layer of copper on said silicon doped silicon layer, and
   sintering said body at a temperature in excess of 400° C.

5. The method of claim 1 wherein there is further intended the step of heating the silicon body to a temperature of 200° C. prior to the deposition of said copper doped silicon layer, and
   said layer of copper doped silicon is deposited to a thickness of 600 angstroms and contains 4 to 5% by weight of copper, and
   the layer of aluminum is deposited to a thickness of 9400 angstroms.

6. The method of claim 2 wherein said silicon body is heated to 200° C. and said deposit of silicon is 200 angstroms in thick and formed by evaporation and said copper doped aluminum layer on said silicon layer is 9800 angstroms thick and contains 4% copper.

7. The method of claim 3 wherein said silicon body is heated to a temperature of 200° C. and said during the deposition said aluminum layer,
   said aluminum layer having a thickness of 9600 angstroms,
   said silicon, a layer of 200 angstroms and said copper layer a thickness of 300 angstroms.

* * * * *

UNITED STATES PATENT AND TRADEMARK OFFICE
CERTIFICATE OF CORRECTION

PATENT NO. : 4,373,966
DATED : Feb. 15, 1983
INVENTOR(S) : S. U. Kim

It is certified that error appears in the above-identified patent and that said Letters Patent are hereby corrected as shown below:

Claim 4, line 3        After doped delete "silicion"
    as printed             and insert --aluminum--.

Claim 4, line 6        Delete "silicon" and insert
    as printed             --aluminum--.

Claim 5, line 10       Delete "intended" and insert
    as printed             --included--.

Signed and Sealed this

Fifth Day of February 1985

[SEAL]

Attest:

DONALD J. QUIGG

Attesting Officer     Acting Commissioner of Patents and Trademarks